(12) United States Patent
Mishra et al.

(10) Patent No.: US 8,952,737 B2
(45) Date of Patent: Feb. 10, 2015

(54) METHODS AND SYSTEMS FOR CALIBRATION OF A DELAY LOCKED LOOP

(71) Applicant: Kool Chip, Inc., San Jose, CA (US)

(72) Inventors: Kishore Mishra, Santa Clara, CA (US); Purna C. Mohanty, Santa Clara, CA (US); Venkata N. S. N. Rao, Fremont, CA (US)

(73) Assignee: Kool Chip, Inc., San Jose, CA (US)

( * ) Notice: Subject to any disclaimer, the term of this patent is extended or adjusted under 35 U.S.C. 154(b) by 0 days.

(21) Appl. No.: 14/065,754

(22) Filed: Oct. 29, 2013

(65) Prior Publication Data

US 2014/0312946 A1     Oct. 23, 2014

Related U.S. Application Data

(60) Provisional application No. 61/814,153, filed on Apr. 19, 2013.

(51) Int. Cl.
   *H03L 7/06*     (2006.01)
   *H03L 7/00*     (2006.01)

(52) U.S. Cl.
   CPC .................................... *H03L 7/00* (2013.01)
   USPC ........................................ 327/158; 327/161

(58) Field of Classification Search
   None
   See application file for complete search history.

(56) References Cited

U.S. PATENT DOCUMENTS 7,339,364 B2 *   3/2008   Kam et al. ............... 324/76.54

* cited by examiner

*Primary Examiner* — Cassandra Cox
(74) *Attorney, Agent, or Firm* — Venture Pacific Law, PC

(57) ABSTRACT

A method for calibrating a delay locked loop ("DLL") having a plurality of delay segments, comprises: determining segment delay values for the delay segments; calculating a full-cycle delay value for an input signal to the DLL; adjusting one or more of the segment delay values as a function of the full-cycle delay value to generate one or more adjusted delay values; and calculating weights for the delay segments as a function of the segment delay values, the full-cycle delay, and the one or more adjusted delay values, wherein the weights are used to calibrate the DLL.

19 Claims, 4 Drawing Sheets

METHODS AND SYSTEMS FOR CALIBRATION OF A DELAY LOCKED LOOP

CROSS REFERENCE

This application claims priority from a provisional patent application entitled "Apparatuses, Methods, and Systems Using Integrated Circuits" filed on Apr. 19, 2013 and having an Application No. 61/814,153. Said application is incorporated herein by reference.

FIELD OF INVENTION

This invention generally relates to methods and systems for calibration of a delay locked loop, and, in particular, to methods and systems for calibration of a delay locked loop for semiconductor devices, including memory devices.

BACKGROUND

In a high speed synchronous semiconductor memory device, such as a double data rate synchronous dynamic random access memory ("DDR SDRAM"), data is transferred to other devices, where the data is synchronized with a clock signal (e.g., a reference clock or an external clock signal). The high speed synchronous semiconductor memory device performs an input or output operation in synchronization with not only a rising edge, but also a falling edge of the clock signal. Typically, in a system or a circuit including a semiconductor memory, the clock signal is used as a reference clock signal for adjusting operation timing to guarantee stable data access and data transfer without error. For stable data access and data transfer, a delay occurring from processing and receiving the data can be compensated for during the data transfer by exactly setting the data transfer at edges of the clock signal or at centers of the clock signal.

Various components of the semiconductor memory device may need a clean copy of the reference clock signal with a predefined phase delay. Thus, a delay locked loop ("DLL") can generate internal clock signals for the system based upon the reference clock signal by compensating for clock skew occurring in the data path and adding phase delays to the reference clock signal. The data path has a predetermined delay amount estimated from the clock skew, where the data or the clock signal passes through the semiconductor memory device. The generated internal clock signals can then be used for synchronizing data input/output.

DLLs can be used to supply these internal clock signals based on the reference clock signal. Typically, DLLs are based on a variable multi-stage delay line, in which the delay is controlled by a phase/frequency detector which compares the signal at the end of the delay line with the reference clock signal. Taps between stages in the delay line provide multiple copies of the reference signal, phase shifted so as to subdivide the clock period into different phase delay levels.

A DLL can provide delays in steps up to a full clock cycle delay for the input signal. Typically, the DLL can have eight delay segments (also referred to as octants) that are connected in series to provide total delay up to one clock period. Each of the DLLs can provide delay around $⅛^{th}$ of the clock cycle. The actual delay can be less or more than $⅛^{th}$ of the clock period due to PVT variations. Since the delays are provided by active elements that work in a feedback loop, these elements need to be calibrated against different phases of the reference clock signal e.g., 45 degrees, 90 degrees, 135 degrees, ... and 315 degrees. However, this is not only costly to generate the reference phases, but imposes routing restrictions to bring these phases to the DLL and to other DLLs of the system for calibration of those DLLs.

Current techniques for calibrating the DLL are to route one or more reference clocks to all the DLLs of the memory system. However, the memory system is quite expansive and would require a great amount of resources to route reference clocks to all of the DLLs of the memory system. Therefore, it is desirable to provide new methods and systems for calibrating a DLL to account for PVT variations.

SUMMARY OF INVENTION

An object of this invention is to provide methods and systems for calibrating a delay locked loop without having to route additional reference clocks for calibrating the delay locked loop.

Another object of this invention is to provide methods and systems for calibrating a delay locked loop using a minimal amount of components.

Yet another object of this invention is to provide methods and systems for quickly calibrating a delay locked loop to meet timing requirements for the operation of the delay locked loop.

Briefly, the present invention discloses a method for calibrating a delay locked loop ("DLL") having a plurality of delay segments, comprising: determining segment delay values for the delay segments; calculating a full-cycle delay value for an input signal to the DLL; adjusting one or more of the segment delay values as a function of the full-cycle delay value to generate one or more adjusted delay values; and calculating weights for the delay segments as a function of the segment delay values, the full-cycle delay, and the one or more adjusted delay values, wherein the weights are used to calibrate the DLL.

An advantage of this invention is that methods and systems for calibrating a delay locked loop without having to route additional reference clocks for calibrating the delay locked loop are provided.

Another advantage of this invention is that methods and systems for calibrating a delay locked loop using a minimal amount of components are provided.

Yet another advantage of this invention is that methods and systems for quickly calibrating a delay locked loop to meet timing requirements for the operation of the delay locked loop.

DESCRIPTION OF THE DRAWINGS

The foregoing and other objects, aspects, and advantages of the invention can be better understood from the following detailed description of the preferred embodiment of the invention when taken in conjunction with the accompanying drawings in which.

DETAILED DESCRIPTION OF THE PREFERRED EMBODIMENTS

In the following detailed description of the embodiments, reference is made to the accompanying drawings, which form a part hereof, and in which is shown by way of illustration of specific embodiments in which the present invention may be practiced.

Generally, a memory system, e.g., DDR SDRAM, requires a clock signal with very fine steps to control the delay precisely for N-bit wide data with the clock signal positioned at the center. To generate the clock signal for the memory system, a delay locked loop ("DLL") of the present invention is used to synchronize one or more internal clock signals to a reference clock for the incoming data signal. The internal clock signals must be very precise clock signals relative to the incoming data.

Figure 1:
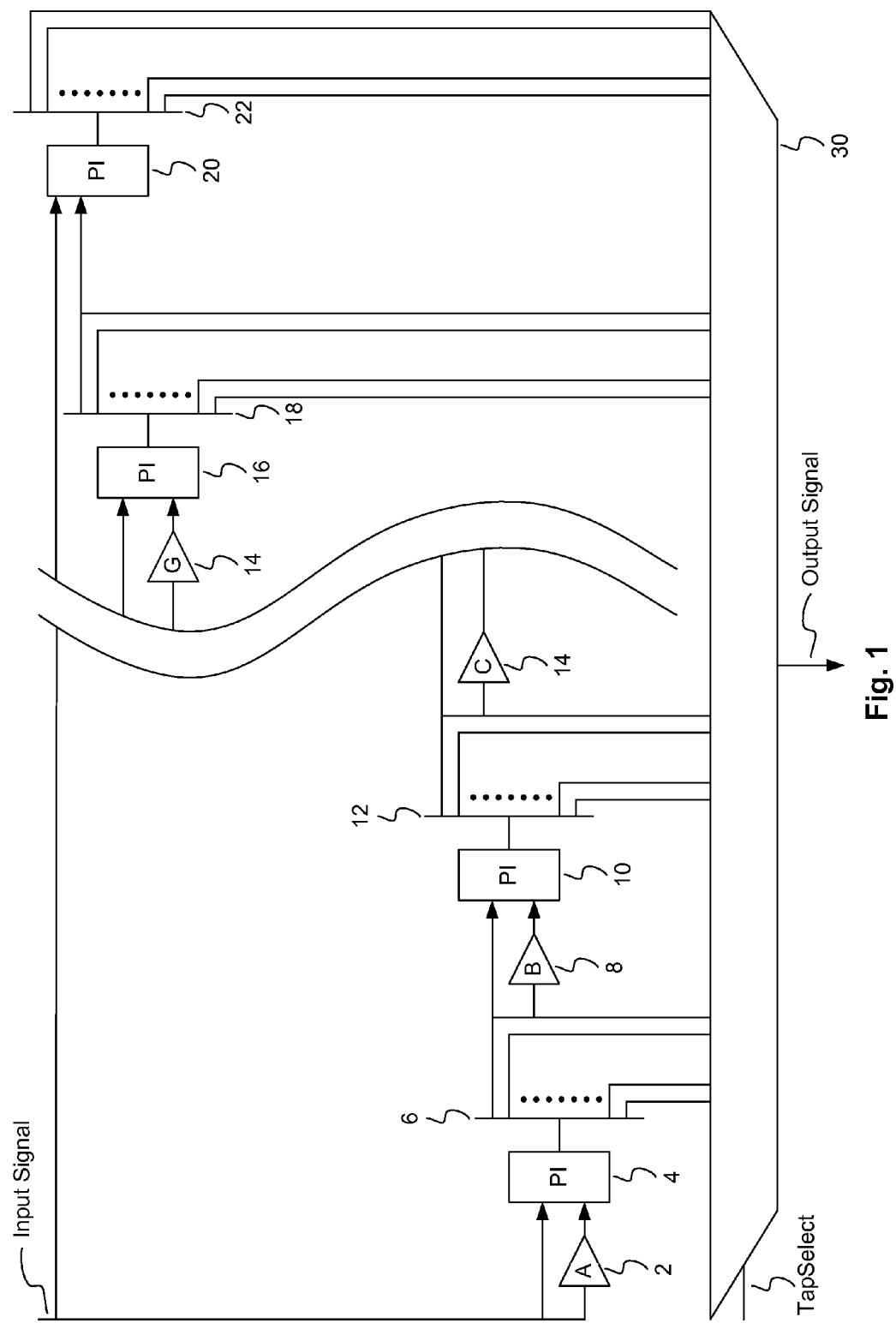
FIG. 1 illustrates a block diagram for a delay chain of the present invention.

FIG. 1 illustrates a block diagram for a delay chain of the present invention. As understood by a person having ordinary skill in the art, a delay chain is an integral component of a DLL for generating various phase delay signals relative to an input signal. A DLL of the present invention has a delay chain that comprises delay segments A-G for receiving an input signal and outputting one or more output signals with predefined phase differences from the input signal. The delay segments A-G can be serially connected such that one segment can apply additional delay from the output signal of a previous delay segment. Thereby, each of the delay segments along the serially-connected delay segments A-G can provide additional phase delays to the input signal.

For instance, the delay segment A applies a 45 degrees phase delay to the input signal, which is outputted to the delay segment B. The delay segment B applies another 45 degrees phase delay upon the output signal of the delay segment A. Thus, the output of the delay segment B has a total of 90 degrees phase difference from the input signal. The additional segments are likewise serially connected to add additional phase delays to the input signal. This can go on until the output signal from the delay segment G, which outputs a phase delay signal that is 315 degrees out of phase from the input signal. Generally, a delay segment H is not needed since the 360 degrees phase difference, i.e., a full clock cycle phase delay, should equal the input signal. However, it is important to note that the number of delay segments can be varied according to various needs of the respective system or the respective DLL.

The delay chain further comprises phase interpolators ("PI") 4, 10, 16 and 20 for generating multiple phase delay levels between two input signals, and taps 6, 12, 18, and 22 for incrementally adding phase delay levels between two inputted signals. The delay segments A-G can be implemented by a buffer, an inverter, or other delay element.

The input signal is inputted to the delay segment A, the PI 4, and the PI 20. The delay segment A provides a phase delay to the input signal (e.g., a 45 degrees phase delay), and then outputs the phase delay signal to the PI 4. The PI 4 interpolates various phase delay levels between those two inputted signals and provides various taps 6 for those levels, which are outputted to the multiplexer 30 for selection according to a tap select control signal. The selected tap of the taps 6 having the greatest phase delay, i.e., 45 degrees for this example, is outputted to the next PI 10 and the delay segment B 8.

The delay segment B provides a phase delay to the output signal from the taps 6 (e.g., a 45 degrees phase delay) and outputs its phase delay signal to the PI 10. Since another 45 degrees phase delay is added, in total the delay segment B outputs a signal that is 90 degrees out of phase with the input signal. The PI 10 interpolates various phase delay levels between the outputted signal of the taps 6 and the phase delay signal from the delay segment B, and provides various taps 12 for those levels, which are outputted to the multiplexer 30 for selection according to a tap select control circuit. A selected tap of the taps 12 having the greatest phase delay is outputted to the next PI (not shown) and the delay segment C.

The delay segments C-F and respective PIs and taps perform in a like manner as previously described. Therefore, the block diagram of those portions has been omitted to aid in the understanding of the present invention.

The delay segment G provides a phase delay to the output signal from the previous taps (e.g., a 45 degrees phase delay) and outputs its phase delay signal to the PI 16. The output signal from the previous taps also is inputted to the PI 16. Since another 45 degrees is added by segment G, in total, the delay segment G outputs a signal that is 315 degrees out of phase with the input signal. The PI 16 interpolates various phase delay levels between the outputted signal of the previous taps and the phase delay signal from the delay segment G, and provides various taps 18 for those levels, which are outputted to the multiplexer 30 for selection according to a tap select control circuit. A selected tap of the taps 18 having the greatest phase delay is outputted to the next PI 20. The next PI 20 can then interpolate various phase delay levels between the input signal and the output from the previous taps 18. The PI 20 provides various taps 22 for those levels, which are outputted to the multiplexer 30 for selection according to the tap select control signal.

In review, each of the delay segments A-G can introduce a predefined amount of delay. Each of the delay segments A-G can have multiple tap points connected to the output of the delay segments A-G to produce various phase delays. When only part of the phase delay from a delay segment is needed, a fraction of the tap points connected to that delay segment can be used to select an intermediate phase delay level. Depending on the delay requirements, some of the delay segments A-G can be used in full, or partially by using one or more of the taps connected to the delay segment. However, the delay segments A-G and the respective taps may not precisely provide a predefined phase delay due to PVT variations, which can cause read and write errors for the associated data.

Figure 2:
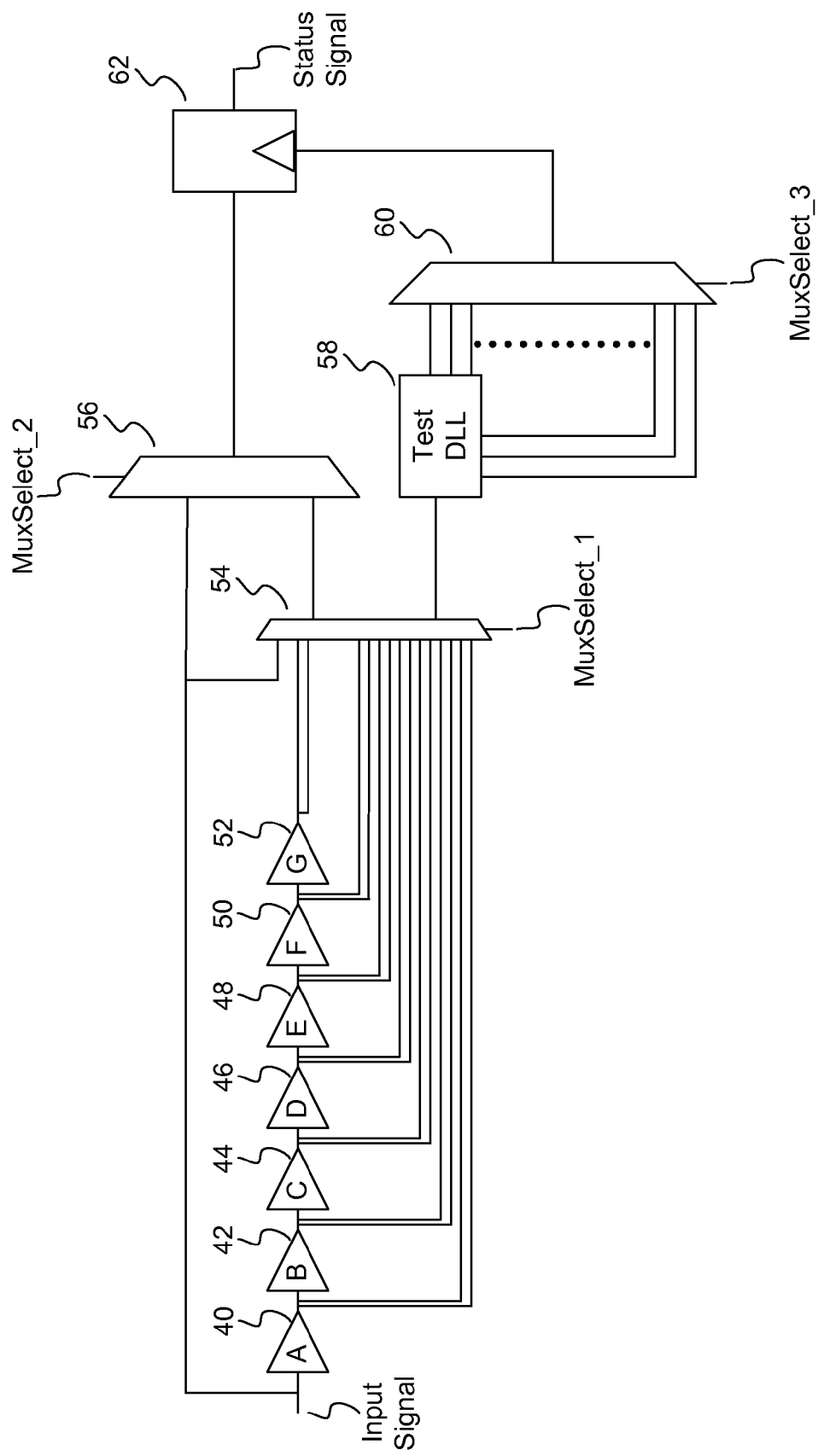
FIG. 2 illustrates a block diagram of the present invention for calibrating a delay locked loop ("DLL").

FIG. 2 illustrates a block diagram of the present invention for calibrating a delay locked loop. The DLL of the present invention comprises delay segments 40-52, multiplexers 54, 56, and 60, test DLL block 58 and a flip-flop 62. The delay segments 40-52 are serially connected such that an output of the delay segments 40-50 may be serially inputted to another delay segment. An input signal can be inputted to the first delay segment 40 in the series of the serially-connected delay segments 40-52. The delay segments 40-52 can provide phase delays to the input signal. The outputs of the delay segments 40-52 and the input signal are inputted to the multiplexer 54 for selecting one of the phase delay signals. A control signal MuxSelect_1 can be used to control which one of the phase delay signals to select.

The selected phase delay signal is outputted to the multiplexer 56 and the test DLL block 58. The multiplexer 56 also receives the input signal as an input as well. A control signal MuxSelect_2 can be used to control which one of the two signals to select for output to the flip-flop 62. The flip-flop 62 is clocked by the outputs of the test DLL block 58 via the multiplexer 60. A control signal MuxSelect_3 can be used to control which one of the outputs of the test DLL block 58 to select and to input to the flip-flop 62. The output of the flip-flop 62 is a status signal. Through the calibration methods of the present invention, the test DLL block 58 can be used to determine a delay value for the delay segments 40-52, for the 180 degrees phase of the input signal, and/or for the 360 degrees phase of the input signal.

Figure 3:
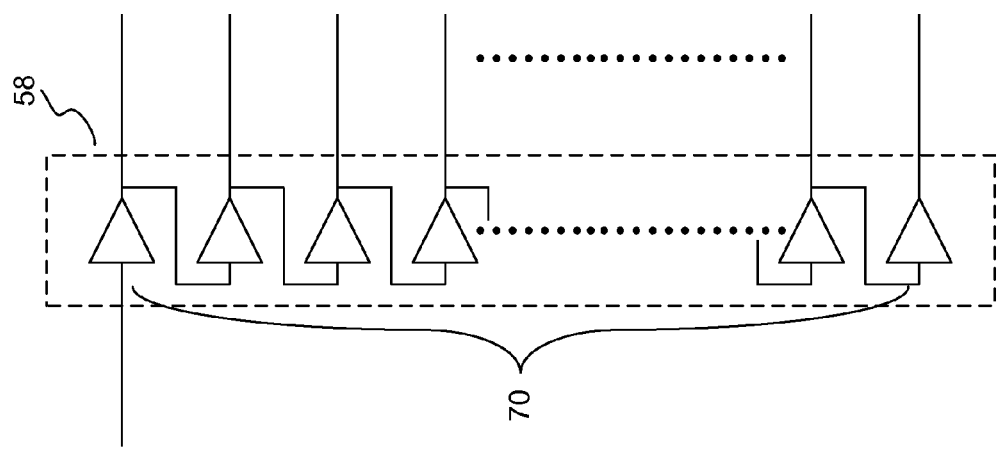
FIG. 3 illustrates a block diagram for a test DLL block of the present invention.

FIG. 3 illustrates a block diagram for a test DLL block of the present invention. The test DLL block 58 can comprise serially-connected passive delay cells 70 (or other types of delay cells, e.g., buffer, transistors, etc.) for determining a delay value for each of the delay segments A-G and for phases of the input signal. The output of the multiplexer 54 is connected to the input of the first passive delay cell. The output of the first passive delay cell is connected to the input of the next passive delay cell. The output of the second passive delay cell is connected to the input of its next passive delay cell. The delay cells 70 are serially-connected in this manner. The outputs of the each of the delay cells 70 are outputted to the multiplexer 60 for selection to be further routed to the flip-flop 62.

When calibration of one of the delay segments A-G is performed, the farthest tap-point for that delay segment is timed using the test DLL block 58. For instance, the delay value for that delay segment can be determined by incrementally increasing the delay in the test DLL block 58 until the phase delay provided by that delay segment matches the phase delay of the test DLL block 58. The number of delay cells 70 of the test DLL block 58 that was needed to reach this phase delay is used for calculating a phase delay. Thus, an approximate delay value for the delay segment can be determined as a function of the delay cells of the test DLL block 58 used for reaching that matched phase delay. The same process is carried on for all the other delay segments to find an approximate delay value for each of the other delay segments.

The test DLL block 58 can likewise be used to determine a delay value for the 180 degrees phase of the input signal, e.g., the reference clock signal of the system. The test DLL block 58 can have a predefine number of passive delay cells for determining the delay value for the 180 degrees phase of the input signal. Alternatively, the test DLL block 58 can have a predefine number of passive delay cells for determining the delay value for each of the segments. For such case, the test DLL block 58 can be reinitialized to use the first passive delay cell of the delay cells 70, when a next delay segment of the delay segments A-G is used to find the delay value of the 180 degrees phase of the input signal. The DLL can sum the delay values for each of the delay segments used to obtain the delay value for the 180 degrees phase of the input signal and any remaining delay cell values from the test DLL block 58. Thereby, the delay value for the 180 degrees phase of the input clock (or multiples thereof, e.g., 360 degrees phase of the input clock) can be calculated. The delay value for the input clock can then be used to derive weights for the delay segments to determine the amount of phase delay that is introduced by each of the delay segments.

Figure 4:
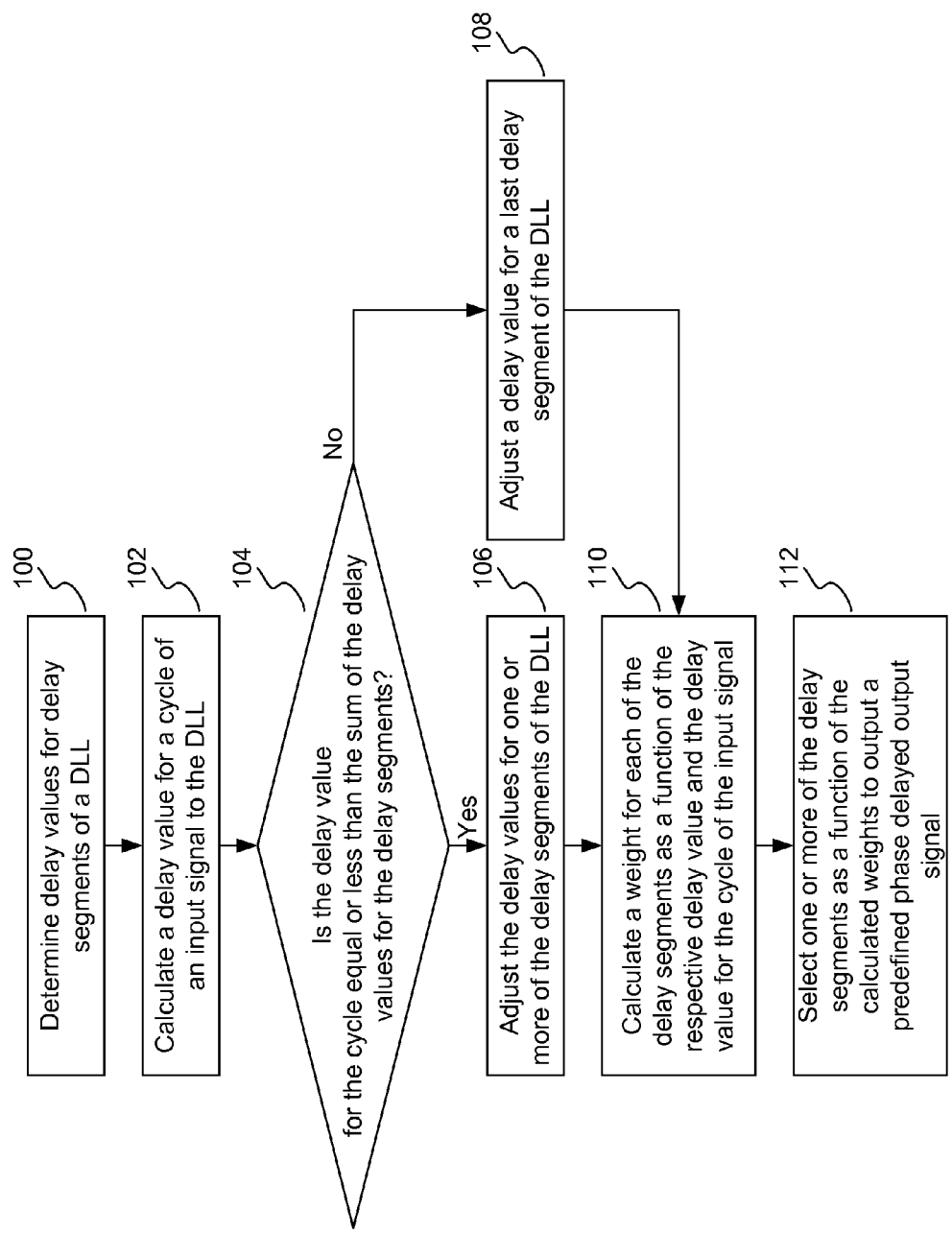
FIG. 4 illustrates a flow chart of the present invention for calibrating a DLL.

FIG. 4 illustrates a flow chart of the present invention for calibrating a DLL. A delay value for each of the delay segments of a DLL can be determined 100 by a DLL of the present invention. A delay value for 360 degrees of the input signal (i.e., a full cycle of the input signal) can be calculated 102 due to the fact the input signal should have a rising edge or falling edge at 180 degrees, 360 degrees, and at multiples thereof. The DLL can determine the delay value by monitoring the input signal for a rising or falling edge and by monitoring the test DLL block to determine when this rising or falling edge occurs in relation to the passive delay cells of the test DLL block. This delay value for the rising or falling edge can be used to determine the delay value for 360 degrees of the input signal.

For instance, assuming there are eight delay segments, each of the delay segments may provide around 45 degrees of phase delay to the input signal, absent any PVT variations and noise. Thus, ideally, each of the delay values of the delay segments should be around ⅛th of the delay value for a clock cycle of the input signal. The last delay segment may not be necessary since providing 360 degrees phase delay of the input signal can be the same as simply inputting the input signal.

If a delay value is determined for 180 degrees of the input signal, then that delay value for 180 degrees of the input signal can be doubled to give the delay value for 360 degrees of the input signal. Alternatively, the DLL can also determine the delay value for 360 degrees of the input signal by using the delay cells of the test DLL block to determine the delay value for a second rising edge or second falling edge of the input signal. The second rising edge or second failing edge can be used for the delay value of the 360 degrees delay sampling since the first rising edge or first falling edge is representative of the 180 degrees of the input signal.

In either case, the delay value for 360 degrees of the input signal (or a cycle of the input signal) is compared with the sum of the delay values for the seven delay segments A-G. In this example, an eighth delay segment may not be needed since the input signal can serve as the 360 degrees phase delay. If the delay segments A-G each provide around 45 degrees of phase delay to the input signal, the sum of these delay segments should provide a delay value of around 315 degrees. Next, it's determined whether the full-cycle delay value of the input signal is equal to or less than the sum of the delay values for the delay segments A-G 104.

If the delay value for a cycle of the input signal is equal to or less than the sum of the delay values for the delay segments A-G, then one or more of the delay segments can have its delay value adjusted 106. For instance, assume the delay values for each of the delay segments A-G are as follows: the delay segment A has the delay value 36; the delay segment B has the delay value 34; the delay segment C has the delay value 35; the delay segment D has the delay value 32; the delay segment E has the delay value 36; the delay segment F has the delay value 34; and the delay segment G has the delay value 35. The cumulative delay value for the first seven delay segments A-G is 242.

If the full-cycle delay value of the input signal is 235, then the 360 degrees delay value falls in the delay segment G. In addition, the difference of the cumulative delay value for the segments and the 360 degrees delay value is 7 units of the delay value, which can be subtracted from the delay value of the segment G.

If the 360 degrees delay value of the input signal falls within any of the other delay segments, then that delay segment in which it falls can be adjusted by the difference of the full-cycle delay value and the sum of the delay values for the previous delay segments up to that delay segment. Any subsequent delay segments can be adjusted to have its delay value equal to zero since these delay segments are not needed to generate a phase delay for the input signal.

For instance, if the full-cycle delay value of the input signal is equal to 140, the full-cycle delay value falls within the delay segment E. The sum of the delay values for the delay segments A-D is 137. The difference of the full-cycle delay value and the sum of the delay values for the delay segments A-D is 3. Thus, only 3 units of the delay segment E's delay value of 36 is used. Any subsequent delay segments, e.g., the delay segments F and G, have an effective delay value of 0 since those delay segments are not used for generating a phase delay for the input signal.

If the full-cycle delay value of the input signal is greater than the sum of the delay segments A-G, then an additional delay segment H can be used. A delay value for the delay segment H can be adjusted 108 to equal the difference of the full-cycle delay value of the input signal and the sum of the delay values for the delay segments A-G. The delay segment H can be implemented by having a phase interpolator interpolate various phase delay levels between the input signal, which can be the 360 degrees phase delay, and the 315 degrees phase delay signal outputted by the delay segment G. Alternatively, a buffer or other implementation can be used to implement the delay segment H.

Assuming the full-cycle delay value of the input signal is equal to 250 and the sum of the delay values for segments A-G is 242, then the adjusted delay value for the delay segment H is equal to 8, which is the difference of the full-cycle delay value and the sum of the delay values for segments A-G.

After one of the delay values for delay segments is adjusted, a weight for each of the delay segments using the adjusted values can be calculated 110. The weight for each of the delay segments can be equal to the delay value (or the adjusted value if any) for a delay segment divided by the calculated delay value for a cycle of the input signal (i.e., the delay value for the 360 degrees of the input signal). Thereby, each of the delay segments can be assigned a weight, which can represent a percentage of 360 degrees phase delay for the input signal.

Using an example above where the full-cycle delay value is equal to 235 and is less than the sum of the delay values for the delay segments A-G, the delay values and the adjusted delay value for the delay segments A-G are as follows: the delay segment A has the delay value 36; the delay segment B has the delay value 34; the delay segment C has the delay value 35; the delay segment D has the delay value 32; the delay segment E has the delay value 36; the delay segment F has the delay value 34; and the delay segment G has the adjusted delay value 28. The adjusted delay value was the original delay value of 35 subtracted by the difference of the delay value of a cycle of the input signal and the sum of the delay values of the delay segments A-G.

Thus, the weight for the delay segment A is equal to 36/235=15.3%, meaning the delay segment A introduces about 55.0 degrees of phase delay. The weight for the delay segment B is equal to 34/235=14.5%, meaning the delay segment B introduces about 52.2 degrees of phase delay. The weight for the delay segment C is equal to 35/235=14.9%, meaning the delay segment C introduces about 53.6 degrees of phase delay. The weight for the delay segment D is equal to 32/235=13.65%, meaning the delay segment D introduces about 49.14 degrees of phase delay. The weight for the delay segment E is equal to 36/235=15.3%, meaning the delay segment E introduces about 55.1 degrees of phase delay. The weight for the delay segment F is equal to 34/235=14.5%, meaning the delay segment F introduces about 52.2 degrees of phase delay. The weight for the delay segment G is equal to 28/235=11.9%, meaning the delay segment G introduces about 42.8 degrees of phase delay.

For the case where the total delay for a cycle of the input signal is equal to 250 and greater than the sum of the delay values for the delay segments A-G, the delay values and the adjusted delay value for the delay segments are as follows: the delay segment A has the delay value 36; the delay segment B has the delay value 34; the delay segment C has the delay value 35; the delay segment D has the delay value 32; the delay segment E has the delay value 36; the delay segment F has the delay value 34; and the delay segment G has the adjusted delay value 35; and the delay segment H can be assigned the delay value 8. The adjusted delay value can be added to the pseudo delay segment H, where that value equals the difference of the delay value of a cycle of the input signal and the sum of the delay values of the delay segments A-G.

Thus, the weight for the delay segment A is equal to 36/250=14.4%, meaning the delay segment A introduces about 51.8 degrees of phase delay. The weight for the delay segment B is equal to 34/250=13.6%, meaning the delay segment B introduces about 49 degrees of phase delay. The weight for the delay segment C is equal to 35/250=14.0%, meaning the delay segment C introduces about 50.4 degrees of phase delay. The weight for the delay segment D is equal to 32/250=12.8%, meaning the delay segment D introduces about 46.1 degrees of phase delay. The weight for the delay segment E is equal to 36/250=14.4%, meaning the delay segment E introduces about 51.8 degrees of phase delay. The weight for the delay segment F is equal to 34/250=13.6%, meaning the delay segment F introduces about 49 degrees of phase delay. The weight for the delay segment G is equal to 35/250=14.0%, meaning the delay segment G introduces about 50.4 degrees of phase delay. The weight for the adjusted delay segment H is equal to 8/250=3.2%, meaning the delay segment H introduces about 11.5 degrees of phase delay. In this case, the full delay value of the delay segment G is used and only part of the delay segment H (e.g., having the delay value 8 in this example) is used to provide a full-cycle (i.e., 360 degrees) phase delay, if needed.

After the weights are calculated, the DLL of the present invention can use this information to provide a more precise phase delayed signal from the input signal within a predefined tolerance by using the weights to determine which of the segments to use to obtain an accurate phase delay 112 for the input signal.

While the present invention has been described with reference to certain preferred embodiments or methods, it is to be understood that the present invention is not limited to such specific embodiments or methods. Rather, it is the inventor's contention that the invention be understood and construed in its broadest meaning as reflected by the following claims. Thus, these claims are to be understood as incorporating not only the preferred apparatuses, methods, and systems described herein, but all those other and further alterations and modifications as would be apparent to those of ordinary skilled in the art.

We claim:

1. A method for calibrating a delay locked loop ("DLL") having a plurality of delay segments, comprising:
   determining segment delay values for the delay segments;
   calculating a full-cycle delay value for an input signal to the DLL;
   adjusting one or more of the segment delay values as a function of the full-cycle delay value to generate one or more adjusted delay values; and
   calculating weights for the delay segments as a function of the segment delay values, the full-cycle delay, and the one or more adjusted delay values,
   wherein the weights are used to calibrate the DLL.

2. The method of claim 1 wherein a test DLL block having passive delay cells is used to determine the segment delay values and used to calculate the full-cycle delay value.

3. The method of claim 2 wherein a segment delay value for a certain one of the delay segments is determined by incrementally increasing a phase delay of the test DLL block until the phase delay provided by the certain one of the delay segments matches the phase delay of the test DLL block.

4. The method of claim 2 wherein the full-cycle delay value is calculated by first determining a half-cycle delay value, and then doubling the half-cycle delay value to obtain the full-cycle delay value.

5. The method of claim 4 wherein the half-cycle delay value is obtained by incrementally increasing the phase delay of the test DLL block until an edge of the input signal is detected.

6. The method of claim 1 wherein the delay segments comprise a delay segment A, a delay segment B, a delay segment C, a delay segment D, a delay segment E, a delay segment F, and a delay segment G.

7. The method of claim 6 in the adjusting one or more of the segment delay values, wherein if the full-cycle delay value is equal to or less than the sum of the segment delay values, then a certain one of the delay segments is assigned a first adjusted delay value as a function of the difference of the sum of the delay values and the full-cycle delay value.

8. The method of claim 7 wherein one or more of subsequent ones of the delay segments to the certain one of the delay segments are assigned a second adjusted delay value that is equal to zero.

9. The method of claim 6 wherein if the full-cycle delay value is greater than the sum of the segment delay values, then the delay segments further comprise a delay segment H, and the difference of the sum of the segment delay values and the full-cycle delay value is a delay value for the delay segment H.

10. A method for calibrating a delay locked loop ("DLL") having a plurality of delay segments, comprising:
   determining segment delay values for the delay segments;
   calculating a full-cycle delay value for an input signal to the DLL;
   adjusting one or more of the segment delay values as a function of the full-cycle delay value to generate one or more adjusted delay values; and
   calculating weights for the delay segments as a function of the segment delay values, the full-cycle delay, and the one or more adjusted delay values,
   wherein a test DLL block having passive delay cells is used to determine the segment delay values and used to calculate the full-cycle delay value,
   wherein a segment delay value for a certain one of the delay segments is determined by incrementally increasing a phase delay of the test DLL block until the phase delay provided by the certain one of the delay segments matches the phase delay of the test DLL block, and
   wherein the weights are used to calibrate the DLL.

11. The method of claim 10 wherein the full-cycle delay value is calculated by first determining a half-cycle delay value, and then doubling the half-cycle delay value to obtain the full-cycle delay value.

12. The method of claim 11 wherein the half-cycle delay value is obtained by incrementally increasing the phase delay of the test DLL block until an edge of the input signal is detected.

13. The method of claim 10 wherein the delay segments comprise a delay segment A, a delay segment B, a delay segment C, a delay segment D, a delay segment E, a delay segment F, and a delay segment G.

14. The method of claim 13 wherein if the full-cycle delay value is greater than the sum of the segment delay values, then the delay segments further comprise a delay segment H, and the difference of the sum of the segment delay values and the full-cycle delay value is a delay value for the delay segment H.

15. The method of claim 10 in the adjusting one or more of the segment delay values, wherein if the full-cycle delay value is equal to or less than the sum of the segment delay values, then a certain one of the delay segments is assigned a first adjusted delay value as a function of the difference of the sum of the delay values and the full-cycle delay value.

16. The method of claim 15 wherein one or more of subsequent ones of the delay segments to the certain one of the delay segments are assigned a second adjusted delay value that is equal to zero.

17. A method for calibrating a delay locked loop ("DLL") having a plurality of delay segments, comprising:
   determining segment delay values for the delay segments;
   calculating a full-cycle delay value for an input signal to the DLL, wherein the full-cycle delay value is calculated by first determining a half-cycle delay value, and then doubling the half-cycle delay value to obtain the full-cycle delay value;
   adjusting one or more of the segment delay values as a function of the full-cycle delay value to generate one or more adjusted delay values; and
   calculating weights for the delay segments as a function of the segment delay values, the full-cycle delay, and the one or more adjusted delay values,
   wherein a test DLL block having passive delay cells is used to determine the segment delay values and used to calculate the full-cycle delay value,
   wherein a segment delay value for a certain one of the delay segments is determined by incrementally increasing a phase delay of the test DLL block until the phase delay provided by the certain one of the delay segments matches the phase delay of the test DLL block,
   wherein the half-cycle delay value is obtained by incrementally increasing the phase delay of the test DLL block until an edge of the input signal is detected, and
   wherein the weights are used to calibrate the DLL.

18. The method of claim 17 wherein the delay segments comprise a delay segment A, a delay segment B, a delay segment C, a delay segment D, a delay segment E, a delay segment F, and a delay segment G, and wherein if the full-cycle delay value is greater than the sum of the segment delay values, then the delay segments further comprise a delay segment H, and the difference of the sum of the segment delay values and the full-cycle delay value is a delay value for the delay segment H.

19. The method of claim 17 in the adjusting one or more of the segment delay values, wherein if the full-cycle delay value is equal to or less than the sum of the segment delay values, then a certain one of the delay segments is assigned a first adjusted delay value as a function of the difference of the sum of the delay values and the full-cycle delay value, and wherein one or more of subsequent ones of the delay segments to the certain one of the delay segments are assigned a second adjusted delay value that is equal to zero.

* * * * *